US011871650B2

(12) United States Patent
Domingues Dos Santos et al.

(10) Patent No.: US 11,871,650 B2
(45) Date of Patent: *Jan. 9, 2024

(54) ORGANIC FIELD-EFFECT TRANSISTOR COMPRISING A DIELECTRIC LAYER EXHIBITING HIGH DIELECTRIC PERMITTIVITY AND BEING STABLE WITH TEMPERATURE

(71) Applicants: ARKEMA FRANCE, Colombes (FR); UNIVERSITE DE BORDEAUX, Bordeaux (FR); INSTITUT POLYTECHNIQUE DE BORDEAUX, Talence (FR); CENTRE NATIONAL DE LA RECHERCHE SCIENTIFIQUE, Paris (FR)

(72) Inventors: Fabrice Domingues Dos Santos, Paris (FR); Thibaut Soulestin, Lyons (FR); Damien Thuau, Bordeaux (FR); Georges Hadziioannou, Leognan (FR)

(73) Assignees: ARKEMA FRANCE, Colombes (FR); UNIVERSITE DE BORDEAUX, Bordeaux (FR); INSTITUT POLYTECHNIQUE DE BORDEAUX, Talence (FR); CENTRE NATIONAL DE LA RECHERCHE SCIENTIFIQUE, Paris (FR)

(*) Notice: Subject to any disclaimer, the term of this patent is extended or adjusted under 35 U.S.C. 154(b) by 711 days.

This patent is subject to a terminal disclaimer.

(21) Appl. No.: 16/637,365
(22) PCT Filed: Aug. 7, 2018
(86) PCT No.: PCT/FR2018/052029
§ 371 (c)(1),
(2) Date: Feb. 7, 2020
(87) PCT Pub. No.: WO2019/030453
PCT Pub. Date: Feb. 14, 2019

(65) Prior Publication Data
US 2021/0376239 A1 Dec. 2, 2021

(30) Foreign Application Priority Data
Aug. 9, 2017 (FR) ........................ 1757604

(51) Int. Cl.
C08L 27/16 (2006.01)
C08J 5/18 (2006.01)
(Continued)

(52) U.S. Cl.
CPC .............. H10K 85/141 (2023.02); C08J 5/18 (2013.01); C08L 27/16 (2013.01); H10K 85/151 (2023.02);
(Continued)

(58) Field of Classification Search
CPC ..... C08L 27/16; C08J 2327/16; C08J 2427/16
See application file for complete search history.

(56) References Cited

U.S. PATENT DOCUMENTS 4,554,335 A 11/1985 Sakagami et al.
4,708,989 A 11/1987 Broussoux et al.
(Continued)

FOREIGN PATENT DOCUMENTS

CN 103187466 A 7/2013
CN 103387682 A 11/2013
(Continued)

OTHER PUBLICATIONS

Office Action dated Mar. 16, 2021, by the European Patent Office in corresponding European Application No. 18 762 380.6-1107, (6 pages).
(Continued)

Primary Examiner — Catherine S Branch
(74) Attorney, Agent, or Firm — Boone IP Law

(57) ABSTRACT

The invention relates to a composition comprising a blend of fluorinated electroactive polymers and having a dielectric permittivity that exhibits greater stability over the operating
(Continued)

temperature range with respect to each polymer employed on its own. The invention also relates to formulations and films produced on the basis of said composition. The invention also relates to a field-effect transistor, at least part of the dielectric layer of which is composed of a blend of fluorinated electroactive polymers.

15 Claims, 3 Drawing Sheets

(51) Int. Cl.
  *H10K 85/10* (2023.01)
  *H10K 10/46* (2023.01)
(52) U.S. Cl.
  CPC ........ *C08J 2327/16* (2013.01); *C08J 2427/16* (2013.01); *C08J 2433/12* (2013.01); *C08L 2203/16* (2013.01); *C08L 2203/20* (2013.01); *C08L 2205/025* (2013.01); *C08L 2205/03* (2013.01); *H10K 10/471* (2023.02)

(56) References Cited

U.S. PATENT DOCUMENTS

| | | |
|---|---|---|
| 5,087,679 A | 2/1992 | Inukai et al. |
| 2015/0307673 A1 | 10/2015 | Domingues Dos Santos et al. |
| 2015/0325228 A1 | 11/2015 | Choi et al. |
| 2016/0087185 A1 | 3/2016 | Cheng |
| 2016/0284714 A1 | 9/2016 | Park et al. |
| 2017/0192354 A1 | 7/2017 | Zhao et al. |
| 2018/0163041 A1 | 6/2018 | Abgrall |
| 2020/0235283 A1 | 7/2020 | Domingues Dos Santos et al. |

FOREIGN PATENT DOCUMENTS

| | | |
|---|---|---|
| CN | 103951917 A | 7/2014 |
| EP | 0206926 A1 | 12/1986 |
| JP | S62-01744 A | 1/1987 |
| KR | 20170034435 A | 3/2017 |
| TW | 201606436 A | 2/2016 |
| WO | 2010116105 A1 | 10/2010 |
| WO | 2011008940 A1 | 1/2011 |
| WO | 2014091130 A1 | 6/2014 |
| WO | 2016039830 A1 | 3/2016 |
| WO | 2016055712 A1 | 4/2016 |
| WO | 2017093145 A1 | 6/2017 |

OTHER PUBLICATIONS

Ullah, et al. "Enhancement of Dielectric and Energy Density Properties in the PVDF-Based Copolymer/Terpolymer Blends" Polymer Engieering and Science, 2015, 7 pages.

Casar et al., "Influencing dielectric properties of relaxor polymer system by blending vinylidene fluoridetrifluoroethylene-based terpolymer with a ferroelectric copolymerx", Journal of Applied Physics, (2014), vol. 115, pp. 104101-1 to 104101-5.

Xia et al., "High Electromechanical Responses in a Poly(vinylidene fluoride-trifluoroethylene-ahlorofluoroethylene)Terpolymer", Advanced Materials, (Nov. 4, 2002), vol. 14, No. 21, pp. 1574-1577.

Office Action (The First Office Action) dated Aug. 27, 2021, by the State Intellectual Property Office of People's Republic of China in corresponding Chinese Patent Application No. 201880052017.84 and an English Translation of the Office Action. (12 pages).

Office Action (Notice of Rejection) dated Jun. 14, 2022, by the Japanese Patent Office in corresponding Japanese Patent Application No. 2020-507048, with English translation. (14 pages).

Search Report dated Apr. 11, 2022, by the Taiwan Intellectual Property Office in corresponding Taiwanese Patent Application No. 107127632, (2 pages).

Jung, S., et al. "Low-voltage-operated top-gate polymer thin-film transistors with high-capacitance P(VDF-TrFE)/PVDF-blended dielectrics" Journal of Applied Physics, vol. 11, No. 3 , Jan. 22, 2011, pp. S213-S218.

Chen, et al., "Enhanced electrocaloric effect in poly(vinylidene fluoride-trifluoroethylene)-based terpolymer/copolymer blends", App Li Ed Physics Letters, May 2012, vol. 100, No. 22, pp. 222902-1 to 222902-4.

Chu, et al., "Energy storage properties of PVDF terpolymer/PMMA blends", High Voltage, Dec. 2016, vol. 1, No. 4, pp. 171-174.

International Search Report (PCT/ISA/210) and translation and Written Opinion (PCT/ISA/237) dated Oct. 19, 2018, by the European Patent Office as the International Searching Authority for International Application No. PCT/FR2018/052029.

Ju, et al., "A flexible tactile-feedback touch screen using transparent ferroelectric polymer film vibrators", Smart Materials and Structures, 2014, 23(7), 074004, 10 pages.

Jung, et al., "Low-voltage-operated top-gate polymer thin-film transistors with high-capacitance P(VDF-TrFE)/PVDF-blended dielectrics", Current Applied Physics, Jan. 2011, vol. 11, No. 3, pp. S213-S218.

Merle, "Mechanical properties of thin films studied by bulge testing", Erlanger, Fau University Press, 2013, pp. 1-148.

Zhu, et al., "Size effects on elasticity, yielding and fracture of silver nanowires: in situ experiments", Physical Review B 85, pp. 045443-1 to 045443-7, 2012.

Office Action dated Jan. 20, 2023, by the Intellectual Property Office in corresponding Korean Patent pplication No. 10-2020-7006370, English Translation only. (7 pages).

ORGANIC FIELD-EFFECT TRANSISTOR COMPRISING A DIELECTRIC LAYER EXHIBITING HIGH DIELECTRIC PERMITTIVITY AND BEING STABLE WITH TEMPERATURE

FIELD OF THE INVENTION

The present invention relates to a composition comprising a blend of fluorinated electroactive polymers and having a dielectric permittivity that exhibits greater stability over the operating temperature range with respect to each polymer employed on its own. The invention also relates to formulations and films produced on the basis of said composition. The invention also relates to a field-effect transistor, at least part of the dielectric layer of which is composed of a blend of fluorinated electroactive polymers. Lastly, the invention relates to an (opto)electronic device, at least one layer or film of which is composed of a blend of fluorinated ferroelectric polymers exhibiting a dielectric permittivity that is considered to be stable over the operating temperature range.

TECHNICAL BACKGROUND

Electroactive polymers are among the most promising materials for organic electronics. Electroactive polymers are polymers capable of converting mechanical or thermal energy into electricity or vice versa. Among these materials are fluorinated copolymers based on vinylidene fluoride (VDF) and trifluoroethylene (TrFE).

These fluorinated electroactive polymers (FEPs) are ferroelectric, which means they exhibit spontaneous electric polarization which may be reversed by applying an electric field. FEPs typically exhibit a spontaneous polarization under an electric field of 150 mV/m of between 40 mC/m$^2$ and 120 mC/m$^2$. Among these polymers, some terpolymers of the type P(VDF-TrFE-Y), where Y is, preferably, chlorotrifluoroethylene (CTFE) or chlorofluoroethylene (CFE), are relaxor ferroelectric FEPs.

FEPs have a relatively high dielectric permittivity (higher than 10) for polymer materials. A high dielectric permittivity allows these polymers to be used in the manufacture of electronic devices, notably organic electronic devices and more particularly field-effect transistors. Specifically, the use of polymers with high dielectric permittivity makes it possible to decrease the electrical consumption of transistors by decreasing the required voltage that has to be applied to the gate to make the semiconductor layer conductive.

The dielectric permittivity of an FEP varies with temperature and is at maximum at a temperature commonly referred to as the Curie temperature (Tc). For conventional ferroelectric polymers, P(VDF-TrFE), this maximum corresponds to a transition from a ferroelectric phase to a paraelectric phase as the temperature increases. Additionally, the Tc is independent of the frequency of the electric field. However, in the case of a relaxor ferroelectric polymer, the Tc varies with the frequency of the electric field. The maximum dielectric permittivity may reach, or even exceed, 30 at the Tc. The Tc varies from 15° C. to 140° C. according to the composition of the FEPs (VDF/TrFE ratio and termonomer Y content).

Variations in dielectric permittivity affect the performance of electroactive devices. Specifically, a number of properties, such as polarization and deformation, are directly related to permittivity. Generally speaking, electroactive devices are incorporated within electronic devices that are not regulated for temperature. In order to maintain constant properties, systems that make it possible to compensate for these variations must be developed. These systems, which are often complex and expensive, limit the use of FEPs in certain electronic devices. Conserving a high and constant dielectric permittivity over a wider temperature range is necessary to further the development of electroactive devices. In one particular case of an electroactive device, the development of field-effect transistors comprising a high-permittivity dielectric layer requires properties that are stable with temperature to ensure that the device operates correctly.

Document EP 0206926 describes blends of ferroelectric polymers with different Curie temperatures, these mixtures aiming to optimize dielectric properties over an extended temperature and frequency range. The blend of a P(VDF-TrFE-CTFE) terpolymer, containing 10 mole percent CTFE, with a P(VDF-TrFE) copolymer, with a VDF-TrFE molar composition of 60-40, (mixture I, corresponding to curve 18 in FIG. 7), makes it possible to obtain a material exhibiting a relative dielectric constant of between 20 and 30 for a temperature range from 20° C. to 100° C., the maximum of which being located at around 80° C. These relative permittivity values, being lower than 30 and varying by +/−5 with respect to an average value of 25, nonetheless remain insufficient for some applications, in particular in the manufacture of transistors.

There is therefore a need to develop a composition that exhibits a high and constant dielectric permittivity over a wider range of temperatures. The invention also aims to provide field-effect transistors with a dielectric layer that consists of a blend of fluorinated electroactive polymers exhibiting high and stable dielectric permittivity over a wide temperature range. Optimizing the blend of polymers makes it possible to obtain a dielectric permittivity that is stabler between 15° C. and 120° C. than that obtained for a single polymer.

SUMMARY OF THE INVENTION

The invention first relates to a composition comprising a blend of fluorinated electroactive polymers, said blend being composed of:
  a) at least one fluorinated terpolymer of formula P(VDF-X-Y) comprising units derived from vinylidene fluoride (VDF), units derived from a monomer X chosen from trifluoroethylene (TrFE), tetrafluoroethylene, chlorotrifluoroethylene (CTFE), vinyl fluoride, 1,1-chlorofluoroethylene, hexafluoropropene, 3,3,3-trifluoropropene, 1,3,3,3-tetrafluoropropene, 2,3,3,3-tetrafluoropropene, 1-chloro-3,3,3-trifluoropropene, 2-chloro-3,3,3-trifluoropropene, and a third monomer Y,
  b) and of at least one copolymer of formula P(VDF-TrFE) comprising units derived from vinylidene fluoride and units derived from trifluoroethylene, the proportion of units derived from trifluoroethylene being greater than 45 mol % relative to the sum of the units derived from vinylidene fluoride and trifluoroethylene.

According to various embodiments, said composition comprises the following features, if need be combined.

According to one embodiment, the third monomer is 1-chloro-1-fluoroethylene or chlorotrifluoroethylene.

According to one embodiment, the proportion of units derived from the monomer Y is from 1 to 15 mol %, more preferably from 1 to 12 mol %, relative to the entirety of the units of said terpolymer.

According to one embodiment, the fluorinated terpolymer (component a) and the fluorinated copolymer (component b) are present in a ratio by weight ranging from 50:50 to 99:1, preferably from 55:45 to 99:1 and more particularly preferably from 60:40 to 95:5.

According to one embodiment, the composition according to the invention further comprises up to 2% by weight of an additive, said additive being a (meth)acrylic polymer, in particular poly(methyl methacrylate).

The invention also relates to a formulation (or ink) produced on the basis of the blend of fluorinated polymers described above in solution in a solvent.

Another subject of the invention is a polymer film or layer produced on the basis of said formulation. This layer has a dielectric permittivity that exhibits greater stability over the operating temperature range with respect to one fluorinated electroactive polymer used on its own.

The invention also relates to an (opto)electronic device comprising a substrate and a film prepared on the basis of the composition described above deposited on the substrate.

According to one embodiment, the device further comprises electrodes on either side of the film, said device preferably being an actuator.

The invention also relates to an organic field-effect transistor comprising a semiconductor element, electrodes and a dielectric layer exhibiting high dielectric permittivity that is stable with temperature. Characteristically, the dielectric layer is at least partly composed of a blend of fluorinated electroactive polymers.

According to one embodiment, said blend of fluorinated electroactive polymers is composed of:
  at least one fluorinated electroactive terpolymer of formula P(VDF-X-Y) comprising units derived from vinylidene fluoride (VDF), units derived from a monomer X chosen from trifluoroethylene (TrFE), tetrafluoroethylene, chlorotrifluoroethylene (CTFE), vinyl fluoride, 1,1-chlorofluoroethylene, hexafluoropropene (HFP), 3,3,3-trifluoropropene, 1,3,3,3-tetrafluoropropene, 2,3,3,3-tetrafluoropropene, 1-chloro-3,3,3-trifluoropropene, 2-chloro-3,3,3-trifluoropropene, and a third monomer Y,
  and of at least one copolymer of formula P(VDF-TrFE) comprising units derived from vinylidene fluoride and units derived from trifluoroethylene.

According to one embodiment, the dielectric layer is at least partly composed of the composition according to the invention described above.

The present invention makes it possible to overcome the drawbacks of the prior art. More specifically, it provides a composition that exhibits a high and constant dielectric permittivity over a wider range of temperatures. This is accomplished by virtue of the combination of a fluorinated electroactive terpolymer and of a copolymer that is compatible with the terpolymer, exhibiting a Curie temperature differing from that of the terpolymer.

It is particularly suitable for the production of dielectric materials for organic transistors. The stability with temperature of the dielectric permittivity improves the performance of organic transistors for use over a wide temperature range.

FIGURES

FIG. 1 shows a schematic diagram of a field-effect transistor. The elements 1 represent the three electrodes: the source, gate and drain. The element 2 represents the dielectric layer which, in the invention, is composed of at least one layer produced on the basis of a blend of fluorinated electroactive polymers exhibiting high dielectric permittivity. The element 3 is the semiconductor.

Figure 4:
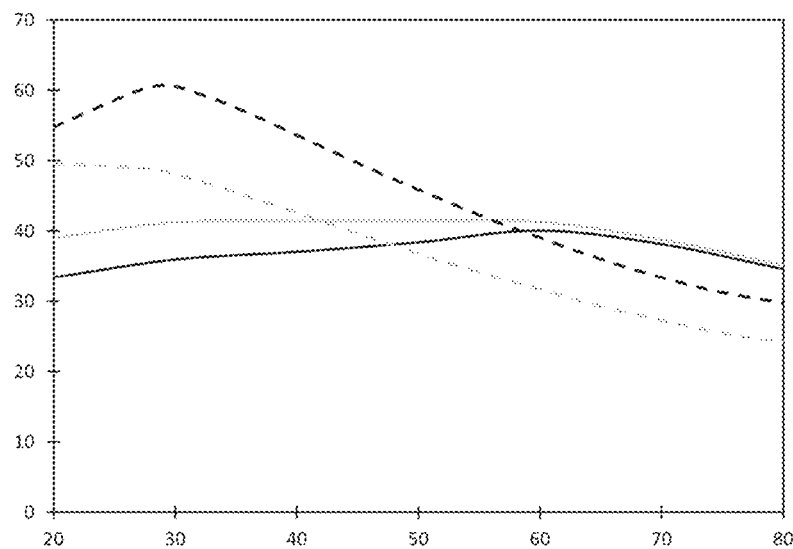

FIG. 4 is a graph illustrating curves of relative permittivity (Y axis), measured at 1 kHz, with temperature (X axis) (rising only shown) for four compositions: (i) broken black line, P(VDF-TrFE-CFE) terpolymer containing 6.9 mol % CFE; (ii) broken gray line, P(VDF-TrFE-CFE) terpolymer with 8.2 mol % CFE; (iii) solid gray line, 70-30 blend by weight of terpolymer (ii) with a P(VDF-TrFE) copolymer with a molar composition of 54/46; and (iv) solid black line, 70-30 blend by weight of terpolymer (i) with a P(VDF-TrFE) copolymer with a molar composition of 54/46.

Figure 5A:
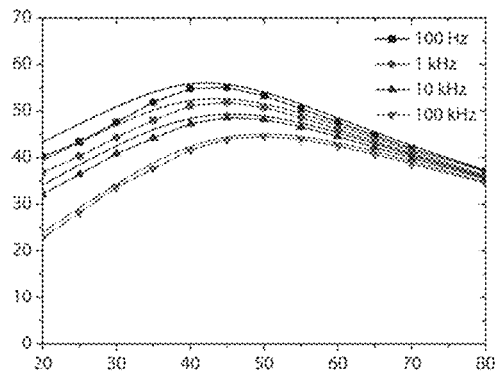
Figure 5B:
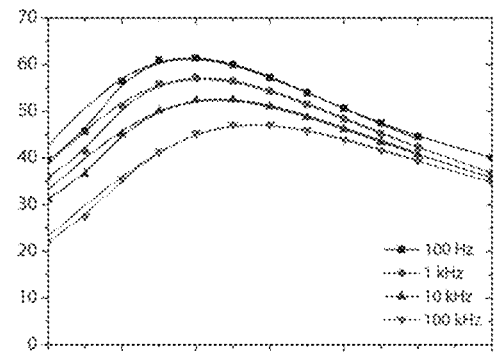

FIG. 5A is a graph illustrating curves of relative permittivity (Y axis) with temperature (X axis) (rising and falling) and with electric field frequency (0.1-1-10-100 kHz) for a 90-10 blend by weight of a P(VDF-TrFE-CFE) terpolymer containing 6.9 mol % CFE and a P(VDF-TrFE) copolymer with a molar composition of 54/46. In FIG. 5B: curves of relative permittivity (Y axis) with temperature (X axis) and with electric field frequency (0.1-1-10-100 kHz) for the same blend further comprising PMMA.

Figure 6:
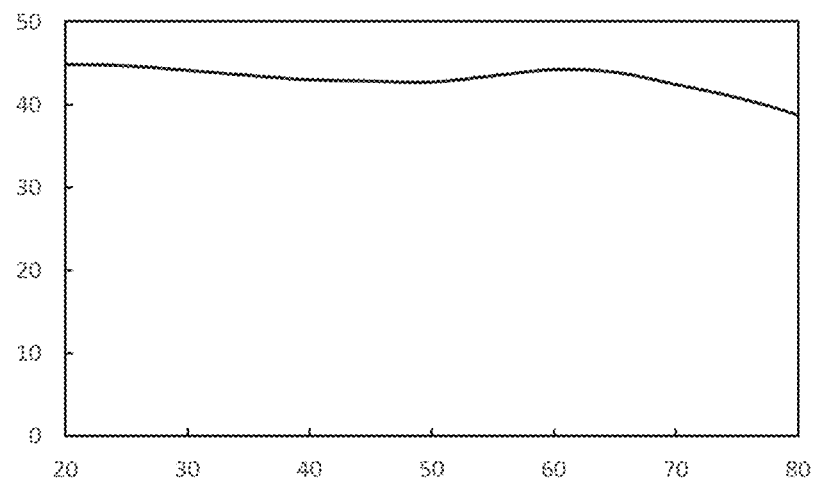

FIG. 6 is a graph illustrating the curve of relative permittivity (Y axis), measured at 1 kHz, with temperature (X axis) (rising and then falling) for a 50-50 blend by weight of a P(VDF-TrFE) copolymer with a molar composition of 43/57 with a P(VDF-TrFE-CFE) terpolymer containing 8.2 mol % CFE.

DESCRIPTION OF EMBODIMENTS OF THE INVENTION

The invention is now described in greater detail and in a non-limiting manner in the description that follows.

The invention is based first on the use of a fluorinated terpolymer (component a). The term "fluorinated" is understood to mean a terpolymer comprising -F groups.

Preferably, the fluorinated terpolymer is a relaxor ferroelectric polymer. Such a material has a weak coercive field (typically weaker than 10 V/$\mu$m), little remanent polarization (typically less than 10 mC/m$^2$), or even none, and a maximum dielectric permittivity with temperature dependent on the frequency of the electric field.

The terpolymer, of formula P(VDF-X-Y), comprises units derived from vinylidene fluoride (VDF), units derived from a monomer X chosen from trifluoroethylene (TrFE), tetrafluoroethylene, chlorotrifluoroethylene (CTFE), vinyl fluoride, 1,1-chlorofluoroethylene (CFE), hexafluoropropene, 3,3,3-trifluoropropene, 1,3,3,3-tetrafluoropropene, 2,3,3,3-tetrafluoropropene, 1-chloro-3,3,3-trifluoropropene, 2-chloro-3,3,3-trifluoropropene, and a third monomer Y.

Preferably, the monomer X is TrFE.

Preferably, Y represents units derived from CFE (1-chloro-1-fluoroethylene) or from CTFE (chlorotrifluoroethylene).

Alternatively, the third monomer may in particular be chosen from halogenated alkenes, in particular halogenated propenes or ethylenes, and for example from tetrafluoropropenes (in particular 2,3,3,3-tetrafluoropropene), chlorotrifluoropropenes (in particular 2-chloro-3,3,3-trifluoropropene), 1-chloro-2-fluoroethylene, trifluoropropenes (in particular 3,3,3-trifluoropropene), pentafluoropropenes (in particular 1,1,3,3,3-pentafluoropropene or 1,2,3,3,3-pentafluoropropene), 1-chloro-2,2-difluoroethylene, 1-chloro-2-fluoroethylene, 1-bromo-2,2-difluoroethylene, bromotrifluoroethylene, fluoroethylene (or vinyl fluoride), tetrafluoroethylene and hexafluoropropene. The third monomer may also be a perfluoroalkyl vinyl ether, of general formula $R_f$—O—CF=CF$_2$, $R_f$ being a preferably $C_1$ to $C_4$ alkyl group. Preferred examples are PPVE (perfluoropropyl vinyl ether) and PMVE (perfluoromethyl vinyl ether).

The terpolymers of the invention may be produced by using any known process, such as emulsion polymerization, microemulsion polymerization, suspension polymerization and solution polymerization. The use of the process described in the document WO 2010/116105 is particularly preferred. This process makes it possible to obtain polymers of high molecular weight and of suitable structuring.

According to one embodiment, the molar proportion of Y units in the terpolymer has a value ranging from 1% to 15%, preferably from 1% to 12%.

According to one embodiment, the molar ratio of the VDF units to the TrFE units in the terpolymer has a value of 85/15 to 30/70 and preferably of 75/25 to 40/60.

According to one embodiment, the weight-average molar mass, which in the context of this patent application is also referred to as the "molecular weight" (Mw), of the terpolymer has a value ranging from 200 000 g/mol to 1 500 000 g/mol, preferably from 250 000 g/mol to 1 000 000 g/mol and more particularly from 300 000 g/mol to 700 000 g/mol.

The latter can be adjusted by modifying certain parameters of the process, such as the temperature in the reactor, or by adding a transfer agent.

The molecular weight distribution can be estimated by SEC (size exclusion chromatography) with dimethylformamide (DMF) as eluent, with a set of three columns of increasing porosity. The stationary phase is a styrene-DVB gel. The detection process is based on measurement of the refractive index, and calibration is performed with polystyrene standards. The sample is dissolved at 0.5 g/l in DMF and filtered through a 0.45 µm nylon filter.

The molecular weight can also be evaluated by measurement of the melt flow index at 230° C. under a load of 5 kg according to ASTM D1238 (ISO 1133).

Moreover, the molecular weight can also be characterized by a measurement of the viscosity in solution according to the standard ISO 1628. Methyl ethyl ketone (MEK) is a preferred solvent for the terpolymers for determining the viscosity index.

More generally, the molar composition of the terpolymers of the invention can be determined by various means. The conventional methods for elemental analysis of carbon, fluorine and chlorine or bromine elements result in a system of two or three independent equations having two independent unknowns (for example % VDF and % TrFE, with % Y=100−(% VDF+% TrFE)), which makes it possible to unambiguously calculate the composition by weight of the polymers, from which the molar composition is deduced.

Use may also be made of multinuclear, in this instance proton ($^1$H) and fluorine ($^{19}$F), NMR techniques, by analysis of a solution of the polymer in an appropriate deuterated solvent. The NMR spectrum is recorded on an FT-NMR spectrometer equipped with a multinuclear probe. The specific signals given by the various monomers in the spectra produced according to one or other nucleus are then identified. Thus, for example, the TrFE (CFH=CF$_2$) unit gives, in proton NMR, a specific signal characteristic of the CFH group (at approximately 5 ppm). The same is true for the CH$_2$ groups of VDF (broad unresolved peak centred at 3 ppm). The relative integration of the two signals gives the relative abundance of the two monomers, i.e. the VDF/TrFE mole ratio.

The combination of the relative integrations of the various signals obtained in proton NMR and in fluorine NMR results in a system of equations, the resolution of which results in the molar concentrations of the various monomer units being obtained.

Finally, it is possible to combine the elemental analysis, for example for the heteroatoms, such as chlorine or bromine, and the NMR analysis. Thus, the content of CTFE or of CFE can be determined by a measurement of the chlorine content by elemental analysis.

A person skilled in the art thus has available a range of methods or combination of methods allowing them to determine, without ambiguity and with the necessary accuracy, the composition of the terpolymers of the invention.

The invention is next based in the use of a copolymer (component b) of formula P(VDF-TrFE) comprising units derived from vinylidene fluoride and units derived from trifluoroethylene, compatible with the terpolymer and exhibiting a Curie temperature differing from that of the terpolymer.

The term "compatible" is understood to mean that the blending of the two polymers forms a homogeneous phase with a single glass transition temperature.

Characteristically, the proportion of units derived from trifluoroethylene in the copolymer is greater than 45 mol % relative to the sum of the units derived from vinylidene fluoride and from trifluoroethylene, and preferably greater than 50 mol %.

The Curie temperature of the copolymer is between 20° C. and 80° C. The Curie temperature of the polymers of the invention may be measured by differential scanning calorimetry or by dielectric spectroscopy.

The composition according to the invention is a blend of fluorinated relaxor ferroelectric polymers comprising at least one fluorinated terpolymer (component a) and at least one P(VDF-TrFE) copolymer with a molar composition of greater than 45 mol % TrFE (component b).

In the composition according to the invention, the proportion by weight of component b) is between 0.1% and 50%, preferably between 1% and 45% and advantageously between 5% and 40% of the total weight of the composition.

The composition of the invention comprises at least one terpolymer as described above (optionally two or more of them) and at least one copolymer as described above (optionally two or more of them).

The composition of the invention may also comprise an additive, the role of which is to increase the dielectric permittivity. According to one embodiment, the composition comprises up to 2% by weight of an additive, said additive being a (meth)acrylic polymer, in particular poly(methyl methacrylate) (PMMA).

Another subject of the invention is a formulation (or ink) based on fluorinated electroactive polymers comprising the composition described above in solution in a solvent. According to one embodiment, said solvent is chosen from dimethylformamide, dimethylacetamide, dimethyl sulfoxide, ketones, in particular acetone, methyl ethyl ketone, methyl isobutyl ketone and cyclopentanone, furans, in particular tetrahydrofuran, esters, in particular methyl acetate, ethyl acetate, propyl acetate, butyl acetate and propylene glycol methyl ether acetate, carbonates, in particular dimethyl carbonate, phosphates, in particular triethyl phosphate, and mixtures thereof.

The solvent may be present in the formulation in a proportion by weight of at least 50%, and preferably of at least 80%.

The formulation of the invention can be produced by dissolving its various compounds in a solvent. The fluorinated electroactive polymers may be dissolved in the solvent at the same time or one after the other, or separately, with the formulations then being mixed. It is preferable to dissolve the terpolymer in the solvent before the copolymer.

The invention provides in particular films produced on the basis of formulations according to the invention and deposited on a substrate. The substrate may, for example, be a polymeric substrate, such as a poly(ethylene terephthalate) or polyethylene naphthalate substrate, or a paper, glass or silicon substrate.

Preferably, the film is deposited by the solvent or molten route, then dried (evaporation of the solvent) and annealed to increase its crystallinity (by heating at a temperature lower than the melting point of the composition and higher than the Curie temperature of the composition for a period of time of greater than or equal to one minute).

Advantageously, the film according to the invention exhibits what is considered a stable relative dielectric permittivity that varies by +/−10, preferably by +/−5 and advantageously by +/−2 over a temperature range from 0° C. to 100° C., preferably from 10° C. to 80° C. and advantageously from 15° C. to 70° C.

The dielectric permittivity may be measured by means of a Sefelec LCR 819 LCR meter, which enables measurement of a capacitance which is proportional to the permittivity.

This film is therefore suitable for manufacturing electronic devices that require a stable permittivity over a wide range of temperatures for their operation.

The invention therefore provides electronic devices comprising a substrate and at least one film according to the invention. The term "electronic device" is understood to mean either a single electronic component or a set of electronic components capable of performing one or more functions in an electronic circuit, such as transistors (notably field-effect transistors), chips, batteries, photovoltaic cells, light-emitting diodes (LEDs), organic light-emitting diodes (OLEDs), sensors, actuators, transformers, haptic devices, electromechanical microsystems, electrocaloric devices, and detectors.

According to certain variations, the electronic device is more particularly an optoelectronic device, i.e. a device that is capable of emitting, detecting or controlling an electromagnetic radiation.

According to one embodiment, the device includes at least one film of the composition of the invention and electrodes on either side, and thus forms an actuator.

Figure 1:
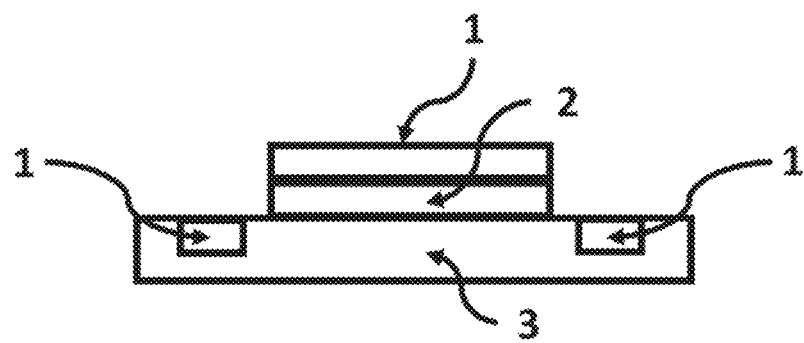

Another subject of the invention relates to an organic field-effect transistor comprising (with reference to the appended FIG. 1), a semiconductor element (3), electrodes (1) and a dielectric layer (2). Characteristically, the dielectric layer is at least partly composed of a blend of fluorinated electroactive polymers.

According to one embodiment, said blend of fluorinated electroactive polymers is composed of:
at least one fluorinated electroactive terpolymer of formula P(VDF-X-Y) comprising units derived from vinylidene fluoride (VDF), units derived from a monomer X chosen from trifluoroethylene (TrFE), tetrafluoroethylene, chlorotrifluoroethylene (CTFE), vinyl fluoride, 1,1-chlorofluoroethylene, hexafluoropropene, 3,3,3-trifluoropropene, 1,3,3,3-tetrafluoropropene, 2,3,3,3-tetrafluoropropene, 1-chloro-3,3,3-trifluoropropene, 2-chloro-3,3,3-trifluoropropene, and a third monomer Y,
and of at least one copolymer of formula P(VDF-TrFE) comprising units derived from vinylidene fluoride and units derived from trifluoroethylene. The monomer X is preferably trifluoroethylene.

According to one embodiment, the dielectric layer is at least partly composed of the composition according to the invention, wherein the proportion of units derived from trifluoroethylene in the copolymer b is greater than 45 mol %, preferably greater than 50 mol %, relative to the sum of the units derived from vinylidene fluoride and from trifluoroethylene.

EXAMPLES

The following examples illustrate the invention without limiting it.

A formulation at 7% by weight in butan-2-one (methyl-ethyl-ketone, MEK) is produced by mixing the one or more electroactive polymers in a round-bottomed flask surmounted by a vertical condenser and heated at 80° C. for 16 h. After complete dissolution, the solution is filtered through a 1 μm filter made of PTFE.

A film of about 250 nm is produced on a silicon substrate, on a spin coater, from the formulation prepared above. It is then dried at 60° C. for five minutes. The films obtained are then annealed at 115° C. for two hours. The upper electrode, made of gold, is deposited by evaporation under vacuum or by sputtering.

The dielectric properties of the films are measured by impedance spectroscopy.

The various compositions studied are presented in table 2 below.

Figure 2:
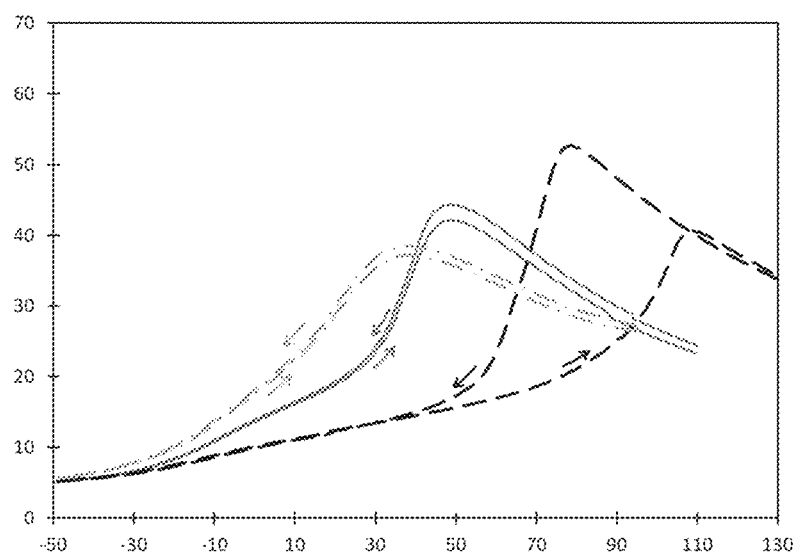
FIG. 2 is a graph illustrating curves of relative permittivity (Y axis), measured at 1 kHz, with temperature (X axis) (rising and then falling) for three fluorinated electroactive polymers: P(VDF-TrFE-CTFE) (dashed-and-dotted curve), P(VDF-TrFE-CTFE) (solid curve) and P(VDF-TrFE) (dashed curve). The VDF/TrFE/Y molar compositions of the polymers are: 60/30/10, 61/35/4 and 70/30, respectively.

Comparative Example—FIG. 2

Figure 3:
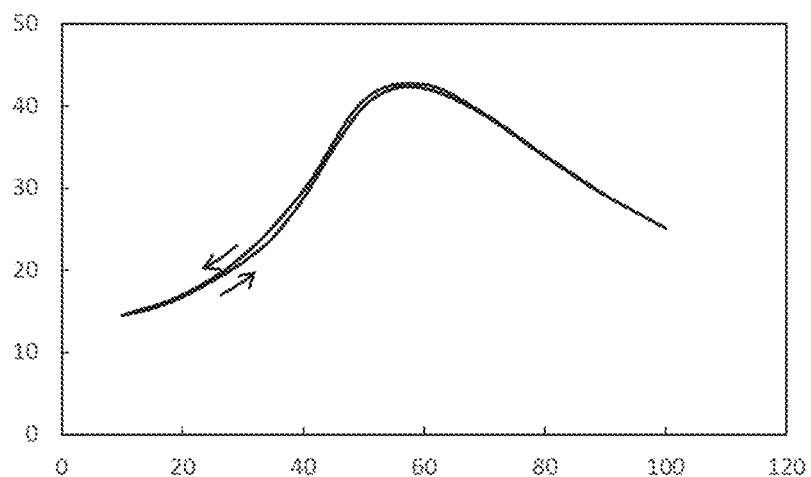
FIG. 3 is a graph illustrating curves of relative permittivity (Y axis), measured at 1 kHz, with temperature (X axis) (rising and then falling) for a P(VDF-TrFE) fluorinated electroactive polymer with a molar composition of 43/57.

FIGS. 2 and 3 show a large change in dielectric permittivity with temperature. Additionally, for the P(VDF-TrFE) copolymer with a molar composition of 70/30, the hysteresis between rising and falling temperature is substantial. Therefore, for the same temperature, there are two possible dielectric permittivity values, which is not desirable for use in field-effect transistors. However, for the P(VDF-TrFE) copolymer with a molar composition of 43/57, the hysteresis is negligible.

The hysteresis observed for some P(VDF-TrFE) copolymers can also be measured by differential scanning calorimetry which makes it possible to measure the Curie temperatures at the transition peak on heating and on cooling. Table 1 contains the Curie temperature values at the transition peak on the second heating and third cooling, measured by DSC. For the P(VDF-TrFE) copolymer with a molar composition of 43/57, delta T is smaller than 2° C.

The article by Su R. et al.; Polymer, 2012, 53, 728-739, DOI: 10.1016/j.polymer.2012.01.001 confirms the presence of this hysteresis for a P(VDF-TrFE) copolymer with a molar composition of 51/49, with a Curie temperature measured at 64° C. on heating and 60° C. on cooling.

TABLE 1

| VDF/TrFE molar composition | $T_{Curie}$ (° C.) Second heating | Third cooling | Delta T |
|---|---|---|---|
| 70/30 | 104.7 | 60.1 | 44.6 |
| 55/45 | 63.0 | 60.0 | 4.6 |
| 43/57 | 59.9 | 58.1 | 1.8 |

TABLE 2

| Composition | Component a | Component b | % by weight | FIG. |
|---|---|---|---|---|
| A | P(VDF-TrFE-CTFE) 10 mol % CTFE | | | 2 dashed-and-dotted curve |
| B | P(VDF-TrFE-CTFE) 4 mol % CTFE | | | 2 solid curve |
| C | | P(VDF-TrFE) 70/30 | | 2 dashed curve |
| D | | P(VDF-TrFE) 43/57 | | 3 |
| E | P(VDF-TrFE-CFE) 6.9 mol % CFE | | | 4 broken black curve |
| F | P(VDF-TrFE-CFE) 8.2 mol % CFE | | | 4 broken gray curve |
| G | P(VDF-TrFE-CFE) 8.2 mol % CFE | P(VDF-TrFE) 54/46 | 70/30 | 4 solid gray curve |
| H | P(VDF-TrFE-CFE) 6.9 mol % CFE | P(VDF-TrFE) 54/46 | 70/30 | 4 solid black curve |
| I | P(VDF-TrFE-CFE) 6.9 mol % CFE | P(VDF-TrFE) 54/46 | 90/10 | 5A |
| J | P(VDF-TrFE-CFE) 6.9 mol % CFE | P(VDF-TrFE) 54/46 | 90/10 + PMMA | 5B |
| K | P(VDF-TrFE-CFE) 8.2 mol % CFE | P(VDF-TrFE) 43/57 | 50/50 | 6 |

Examples According to the Invention—FIGS. 4 to 6

The terpolymers on their own exhibit a dielectric permittivity that varies greatly with temperature. However, stability in dielectric permittivity is observed in the case of the studied blends with a TrFE-rich copolymer (FIGS. 4 and 6). Adding a copolymer does not lead to the emergence of hysteresis in the blend (FIG. 5). An increase in dielectric permittivity is observed. This result is surprising and differs from the examples in patent WO 2017/093145 in which the addition of 3% or 6% PMMA decreases permittivity (comparative examples C2 and C3).

The invention claimed is:

1. A composition comprising a blend of fluorinated electroactive polymers, said blend being composed of:
   a) at least one fluorinated terpolymer of formula P(VDF-X-Y) comprising units derived from:
      vinylidene fluoride (VDF),
      units derived from a monomer X, X being trifluoroethylene (TrFE), and
      a third monomer Y chosen from either chlorotrifluoroethylene or 1,1-chlorofluoroethylene, wherein the units derived from the monomer Y contribute from 1 to 15 mol % towards the sum of units of the at least one fluorinated terpolymer; and
   b) at least one copolymer of formula P(VDF-TrFE) comprising units derived from vinylidene fluoride and units derived from trifluoroethylene, the proportion of units derived from trifluoroethylene being greater than 50 mol % relative to the sum of the units derived from vinylidene fluoride and trifluoroethylene.

2. The composition as claimed in claim 1, wherein the units derived from the monomer Y contribute from 1 to 12 mol % towards the sum of units of the at least one fluorinated terpolymer.

3. The composition as claimed in claim 1, wherein the proportion by weight of component b) is between 10 wt % and 50 wt % of the total weight of the composition.

4. The composition as claimed in claim 1, wherein the proportion of units derived from trifluoroethylene in the copolymer is greater than 50 mol % relative to the sum of the units derived from vinylidene fluoride and from trifluoroethylene.

5. The composition as claimed in claim 1, further comprising up to 2% by weight of an additive, said additive being a (meth)acrylic polymer.

6. The composition as claimed in claim 1, said composition exhibiting a relative permittivity $\varepsilon_r$ of higher than 30 measured at 1 kHz over a temperature range from 20° C. to 80° C.

7. A formulation based on fluorinated electroactive polymers comprising the composition as claimed in claim 1 in solution in a solvent.

8. The formulation as claimed in claim 7, wherein said solvent is chosen from dimethylformamide, dimethylacetamide, dimethyl sulfoxide, ketones, furans, esters, carbonates, phosphates, and mixtures thereof.

9. The composition as claimed in claim 1, wherein the proportion by weight of component b) is between 30 wt % and 50 wt % of the total weight of the composition.

10. The composition as claimed in claim 1, wherein the proportion by weight of component b) is between 40% and 50% of the total weight of the composition.

11. The composition of claim 1, wherein the composition is configured to exhibit a relative dielectric permittivity that varies by +/−10 measured at 1 kHz over a temperature range from 0° C. to 100° C.

12. The composition of claim 1, wherein the composition is configured to exhibit a relative dielectric permittivity that varies by +/−10 measured at 1 kHz over a temperature range from 15° C. to 80° C.

13. The composition of claim 1, wherein the composition is configured to exhibit a relative dielectric permittivity that varies by +/−5 measured at 1 kHz over a temperature range from 0° C. to 100° C.

14. The composition of claim 1, wherein the composition is configured to exhibit a relative dielectric permittivity that varies by +/−5 measured at 1 kHz over a temperature range from 15° C. to 80° C.

15. The composition of claim 1, wherein the composition is configured to substantially not exhibit hysteresis in dielectric permittivity between rising and falling temperatures over a temperature range from 0° C. to 100° C. when dielectric permittivity is measured at 1 kHz.

* * * * *